(12) United States Patent
Farnworth et al.

(10) Patent No.: US 6,903,465 B2
(45) Date of Patent: Jun. 7, 2005

(54) METHOD AND APPARATUS FOR A SEMICONDUCTOR PACKAGE FOR VERTICAL SURFACE MOUNTING

(75) Inventors: Warren Farnworth, Nampa, ID (US); Larry Kinsman, Boise, ID (US); Walter Moden, Meridien, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/949,683

(22) Filed: Sep. 10, 2001

(65) Prior Publication Data

US 2002/0030284 A1 Mar. 14, 2002

Related U.S. Application Data

(63) Continuation of application No. 09/143,765, filed on Aug. 31, 1998, now Pat. No. 6,291,894.

(51) Int. Cl.⁷ .............................................. H01L 23/28
(52) U.S. Cl. ....................................... 257/787; 257/666
(58) Field of Search ................................ 257/787–796, 257/666; 438/112, 124, 127, 126

(56) References Cited

U.S. PATENT DOCUMENTS

| | | | |
|---|---|---|---|
| 4,446,475 A | 5/1984 | Gercekci et al. ............... 357/40 |
| 5,126,286 A | * 6/1992 | Chance ........................ 437/203 |
| 5,331,205 A | * 7/1994 | Primeaux ..................... 257/790 |
| 5,360,992 A | 11/1994 | Lowrey et al. ............. 257/666 |
| 5,362,679 A | 11/1994 | Wakefield .................... 437/206 |
| 5,517,754 A | 5/1996 | Beilstein, Jr. et al. ........ 29/840 |
| 5,530,286 A | 6/1996 | Murakami et al. .......... 257/692 |
| 5,536,970 A | * 7/1996 | Higashi et al. .............. 257/676 |
| 5,583,375 A | 12/1996 | Tsubosaki et al. .......... 257/692 |
| 5,646,067 A | 7/1997 | Gaul ........................... 437/180 |
| 5,677,566 A | 10/1997 | King et al. .................. 257/666 |
| 5,731,222 A | 3/1998 | Malloy et al. ............... 437/182 |
| 5,814,881 A | * 9/1998 | Alagaratnam et al. ...... 257/686 |
| 5,814,894 A | 9/1998 | Igarashi et al. ............. 257/787 |
| 5,824,569 A | 10/1998 | Brooks et al. .............. 438/127 |
| 5,910,687 A | 6/1999 | Chen et al. .................. 257/784 |
| 5,952,710 A | * 9/1999 | Kobayashi ................... 257/666 |
| 6,037,652 A | * 3/2000 | Matsutomo .................. 257/666 |
| 6,054,754 A | * 4/2000 | Bissey ......................... 257/666 |
| 6,063,139 A | * 5/2000 | Fukaya ....................... 29/25.01 |
| 6,072,239 A | * 6/2000 | Yoneda et al. .............. 257/730 |
| 6,291,894 B1 | * 9/2001 | Farnworth et al. .......... 257/780 |
| 6,590,279 B1 | * 7/2003 | Huang et al. ................ 257/676 |
| 2002/0192873 A1 | * 12/2002 | Corisis ........................ 438/123 |

* cited by examiner

Primary Examiner—Eddie Lee
Assistant Examiner—Douglas W. Owens
(74) Attorney, Agent, or Firm—Williams, Morgan & Amerson

(57) ABSTRACT

A method for packaging a semiconductor device includes connecting a plurality of wire leads to a corresponding plurality of electrical connection pads on the semiconductor device, covering at least a portion of the semiconductor device and at least a portion of each of the wire leads with an encapsulating material, and removing a portion of the encapsulating material and a portion of each of the wire leads to form a packaged semiconductor device wherein each of the wire leads has an exposed portion only at an end. The invention also includes a packaged semiconductor device having an integrated circuit device with a plurality of electrical connection pads, a plurality of wire leads coupled to the plurality of electrical connection pads, and a covering of encapsulating material covering at least a portion of the integrated circuit device and covering each of the wire leads, wherein each of the wire leads has an exposed end. The present invention contemplates wire bonding and encapsulation of individual die as well as multiple die on a single wafer.

17 Claims, 4 Drawing Sheets

METHOD AND APPARATUS FOR A SEMICONDUCTOR PACKAGE FOR VERTICAL SURFACE MOUNTING

This is a continuation of application Ser. No. 09/143,765 filed Aug. 31, 1998 now U.S. Pat. No. 6,291,894.

BACKGROUND OF THE INVENTION

1. Field of the Invention

This invention relates generally to the packaging of semiconductor dice and, more particularly, to the packaging of semiconductor dice to facilitate vertical mounting on a printed circuit board.

2. Description of the Related Art

Semiconductor dice are normally formed in large quantities on a wafer of semiconductor material, for example, silicon. After the dice are singulated from the wafer, they may be individually packaged in a plastic or ceramic package, for example. A lead frame may support the die for wire bonding and packaging and provide the lead system for the completed package. In general, electrical circuitry formed on the die is coupled to bond pads on the die to facilitate interconnection of the electrical circuitry with the outside world. During the wire bonding and packaging process, each bond pad is electrically connected by way of wire leads to the lead frame. The electrical connection includes a wire bond formed on the bond pad, a wire lead and a wire bond formed on the lead frame. An encapsulating material protects and insulates the die, and the die is mounted in a package having external pins for interconnecting the electrical circuitry on the die, via the wire bonds, to the outside world.

The packaged die may be mounted to a printed circuit board for constructing an electronic device such as a computer. One problem associated with conventionally packaged die is that the package occupies a relatively large amount of space on the printed circuit board. To address this problem, multi-chip modules have been developed that utilize bare or unpackaged semiconductor dice. However, because bare dice are thin and fragile, packages called connectors have been developed to electrically connect and house multiple bare dice for mounting a supporting substrate to a printed circuit board. One problem with this type of connector is that it is difficult to make a reliable electrical connection to a bare die. In addition, the bare die is often damaged during insertion into the connector.

Another method that has been developed to address the above-mentioned problem associated with conventionally packaged dice involves the addition of contact pads to the integrated circuit device. The contact pads are aligned along one edge of the die, and each contact pad is interconnected by means of an electrical trace to a bond pad on the die. Thus, each of the bond pads on the die is electrically coupled to a contact pad, all the contact pads being situated along a single edge of the die. After an encapsulating material is deposited or otherwise formed over the die, openings are made in the encapsulating material over the contact pads. A multi-chip holder, having electrical contacts on its bottom surface, is adapted to receive multiple dice oriented vertically in the holder. The contacts at the bottom surface of the holder engage the contact pads on the edge of the encapsulated die and mate with electrical traces on a printed circuit board to complete the interconnection between the electrical traces on the printed circuit board and the electrical circuit on the encapsulated die. This method is illustrated in U.S. Pat. No. 5,593,927 to Farnworth et al., entitled "METHOD FOR PACKAGING SEMICONDUCTOR DICE". Although encapsulation provides additional protection to the die, this method nevertheless suffers from some of the same deficiencies of previous methods.

SUMMARY OF THE INVENTION

The present invention includes a method for packaging a semiconductor device comprising connecting a plurality of wire leads to a corresponding plurality of electrical connection pads on the semiconductor device. The method further includes covering at least a portion of the semiconductor device and at least a portion of each of the wire leads with an encapsulating material. Finally, the method includes removing a portion of the encapsulating material and a portion of each of the wire leads to form a packaged semiconductor device wherein each of the wire leads has an exposed portion at a surface of the encapsulating material.

The present invention also includes a packaged semiconductor device comprising an integrated circuit device having a plurality of electrical connection pads and a plurality of wire leads coupled to the plurality of electrical connection pads. The device includes a covering of encapsulating material covering at least a portion of the integrated circuit device and covering each of the wire leads, wherein each of the wire leads has an exposed end.

The present invention further includes a processed semiconductor wafer comprising a semiconductor wafer having first and second integrated circuit devices formed on a first surface of the wafer. A plurality of wire leads is coupled between the first and second integrated circuit devices, and a covering of encapsulating material covers at least the first and second integrated circuit devices and the wire leads coupled between the first and second integrated circuit devices.

BRIEF DESCRIPTION OF THE DRAWINGS

The invention may be understood by reference to the following description taken in conjunction with the accompanying drawings, in which like reference numerals identify like elements, and in which.

Figure 1:
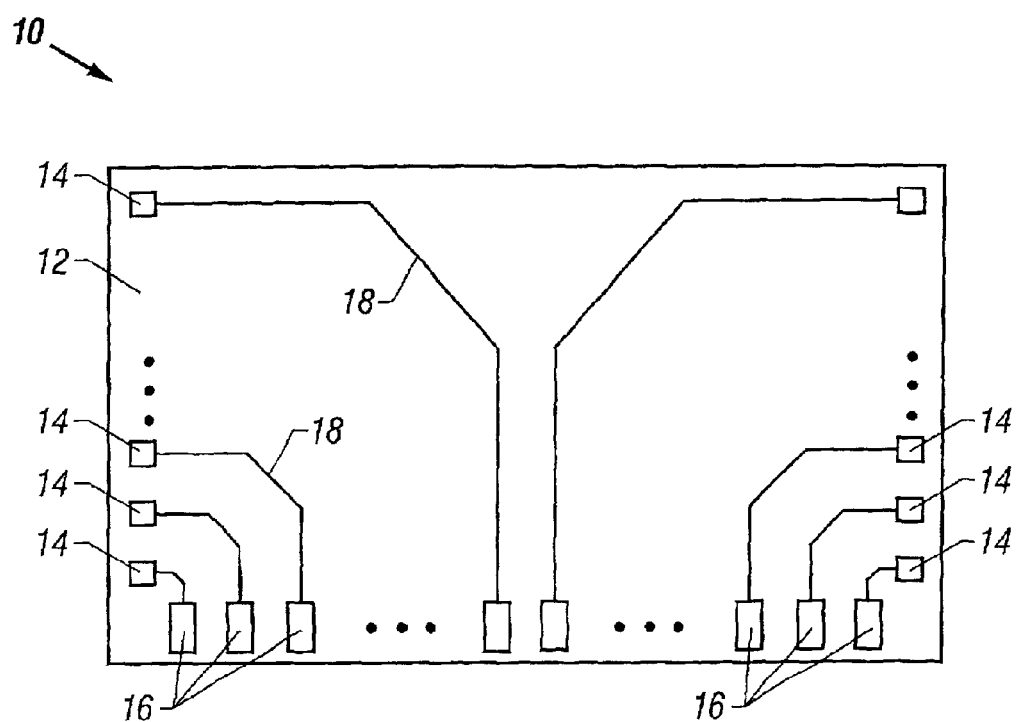
FIG. 1 is a plan view of an integrated circuit die showing bond pads, contact pads and interconnecting electrical traces.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 is a plan view of an integrated circuit device 10 comprising a substrate 12 in which various electrical devices have been formed using techniques that are well known in the art. Formed on the substrate 12 is electrical circuitry (not shown) to interconnect the electrical devices formed in the substrate 12 with each other and with bond pads 14. The bond pads 14 typically form a connection between the electrical circuitry on the integrated circuit device 10 with the outside world. In the case of the integrated circuit device 10 of FIG. 1, the bond pads 14 are interconnected with contact pads 16 by electrical traces 18. Whereas the bond pads 14 are generally arranged about the periphery of the integrated circuit device 10, the contact pads 16 are aligned along a single edge of the integrated circuit device 10. Thus, all the bond pads 14 may be accessed via the contact pads 16 along the single edge of the integrated circuit device 10, and the integrated circuit device 10 is suitable for vertical mounting on a printed circuit board (not shown). While the integrated circuit device 10 of FIG. 1 illustrates contact pads 16 interconnected with bond pads 14 by electrical traces 18, it will be appreciated by those of ordinary skill in the art that the contact pads 16 may be interconnected with the electrical circuitry in the integrated circuit device 10 by any of a variety of known techniques. One technique that may be utilized is that described above and illustrated in U.S. Pat. No. 5,593,927 to Farnworth et al., entitled "METHOD FOR PACKAGING SEMICONDUCTOR DEVICE", which is hereby incorporated by reference in its entirety. For purposes of the present invention, the contact pads 16 may replace the bond pads 14, wherein the electrical circuitry on the substrate 12 will be connected directly to the contact pads 16 rather than through the bond pads 14 and the electrical traces 18. Alternatively, the bond pads 14 may be arranged along a single edge of the integrated circuit device 10. For purposes of the present invention, it is simply preferred, although not required, that pads provided to interconnect the circuitry of the integrated circuit device 10 with the outside world be situated along a single edge of the integrated circuit device 10, regardless of the means by which that positioning is accomplished.

Figure 2:
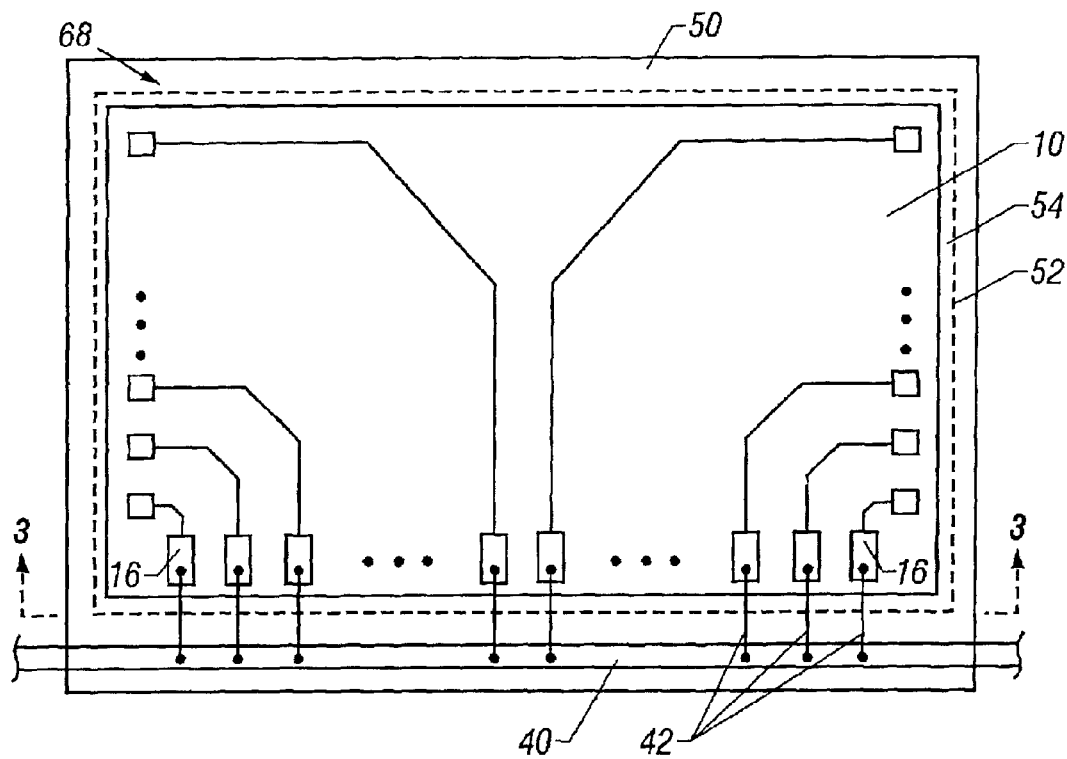
FIG. 2 is a plan view showing an encapsulated die interconnected to a portion of a lead frame.

FIG. 2 shows the integrated circuit device 10 having the contact pads 16 situated along a single edge of the die 10. As will be appreciated by those of ordinary skill in the art, the die 10 may be mounted on a lead frame 40 to facilitate connection of the contact pads 16 to the lead frame by wire leads 42. As is customary in the art, the die 10 is covered with a protective layer (not shown), and vias are formed in the protective layer over the contact pads 16 to expose the contact pads 16. Thus, the wire leads 42 may be bonded to the contact pads 16 at one end and bonded to the lead frame 40 at their other end. Bonding between the contact pads 16 and the lead frame 40 is by conventional means and will be well understood by those of ordinary skill in the art.

After wire bonding the die 10 to the lead frame 40, the die 10 and lead frame 40 are encased in an encapsulating material 50 to form an encapsulated die 68. After encapsulation, the die 68 is singulated from the lead frame 40 along a line 52. In this singulation process, the wire leads 42 shear at the edge of the encapsulating material 50. In cutting the encapsulated die 68 from the lead frame 40, the distance between the edge of the integrated circuit device 10 and the edge of the encapsulated material 50, illustrated as distance 54 in FIG. 2, may be made very small. For example, the distance 54 may be on the order of 5 mils. Moreover, typically the contact pads 16 will be approximately 2 mils from the edge of the device 10. Thus, the overall distance between the contact pads 16 and the edge of the encapsulating material 50, after singulation of the encapsulated die 68 from the lead frame 40, may be on the order of 7 mils. This short wire lead length aids in reducing the inductance associated with the wire leads 42 and helps speed operation of the integrated circuit device and its interaction with the printed circuit board on which it is mounted. The result of these wire bonding, encapsulation and singulation steps is a leadless package for the integrated circuit device 10. Moreover, the integrated circuit device 10 may be completely encased in the encapsulating material 50, leaving no surface of semiconductor exposed. Alternatively, the encapsulating material 50 may be made to cover only a top surface of the integrated circuit device 10, leaving a back surface as an exposed semiconductor material. As will be seen below in an alternative embodiment of the inventive method, the bottom surface as well as side surfaces of the semiconductor material may remain exposed.

Figure 3:
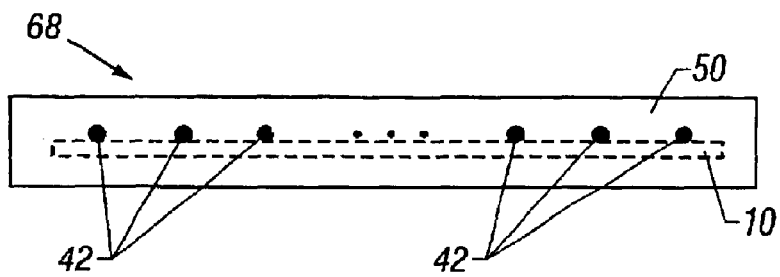
FIG. 3 is an elevation view showing one edge of an encapsulated die having wire leads protruding therefrom.

FIG. 3 shows an elevation view, after singulation of the encapsulated die 68 from the lead frame 40, of the edge of the encapsulated die 68 along the edge of the encapsulating material 50 from which the ends of the wire leads 42 may be seen. The wire leads 42 will be typically separated by a distance of from 2 or 3 mils to perhaps 20 mils. As will be more fully explained below, no further processing or packaging of the die 68 is necessary before mounting the die 68 to a printed circuit board and completing its electrical connection to the printed circuit board. However, if desired, solder bumps may be formed on the exposed end of each of the wire leads 42 to facilitate the interconnection of the wire leads 42 with electrical traces on the printed circuit board. Forming solder bumps on the ends of the wire leads 42 may be accomplished by those of ordinary skill in the art. The process is well-known and generally involves dipping the edge of the encapsulated die 68 in a liquid solder. When the encapsulated die 68 is removed from the liquid solder, the solder will form bumps on the exposed end of each of the leads 42 but will not adhere to the encapsulating material 50. Thus, the wire leads 42 will not be electrically shorted together.

Figure 4:
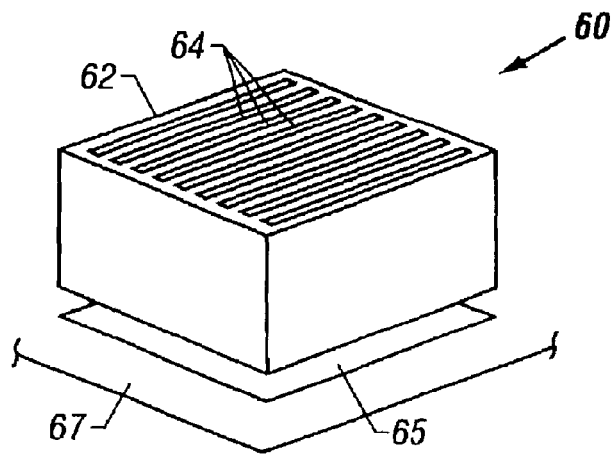
FIG. 4 shows a multi-chip holder adapted to receive a plurality of dice packaged according to the present invention.

FIG. 4 shows a multi-chip holder 60 comprising a base 62. The base 62 includes a plurality of die slots 64 adapted to receive a corresponding plurality of encapsulated dice 68, packaged in accordance with the present invention. The die slots 64 extend completely through the base 62, and an encapsulated die 68 installed in a die slot 64 will have its lower edge exposed at the bottom of the slot 64. In mounting the multi-chip holder 60 to a printed circuit board 67, an axially conductive film 65 may be utilized. The film 65 covers a bottom face of the base 62 and is sandwiched between the base 62 and the printed circuit board 67 when the holder 60 is mounted to the printed circuit board 67. The axially conductive film 65 is known to those of ordinary skill in the art and is conductive only in a direction perpendicular to the plane of the film. An example of axially conductive film that is useful is Shin-Etsu Inter-Connector made by Shin-Etsu Polymer Co. in Tokyo, Japan. In effect, the axially conductive film 65 comprises densely packed conductors that will conduct only in a direction perpendicular to the plane of the film 65. When sandwiched between the holder 60 and the printed circuit board 67, the axially conductive film 65 facilitates interconnection between the wire leads 42 on the encapsulated die 68 in the die slot 64 with electrical circuit traces on the printed circuit board 67.

Figure 5:
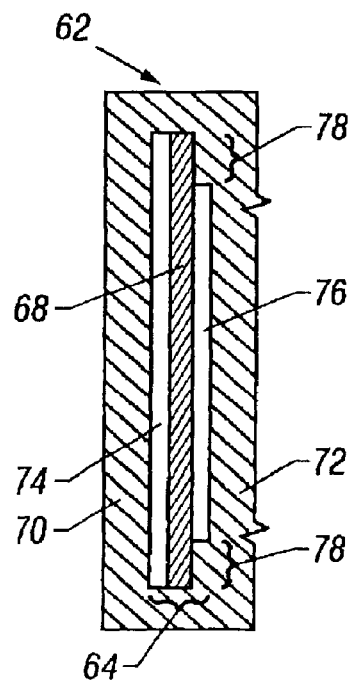
FIG. 5 shows a plan view of one die slot of a multi-chip holder with an encapsulated die disposed therein.

FIG. 5 shows a plan view of one die slot 64 in the base 62 of the multi-chip holder 60. The die slot 64 is bounded by a front wall 70 and a rear wall 72 and is adapted to receive the encapsulated die 68. Shelves 78 at either end of the rear wall 72 are adapted to engage the back of the encapsulated die 68, leaving a gap 76 between the back of the encapsulated die 68 and the rear wall 72. A gap 74 is also formed between the face of the encapsulated die 68 and the front wall 70 of the die slot 64.

Figure 6:
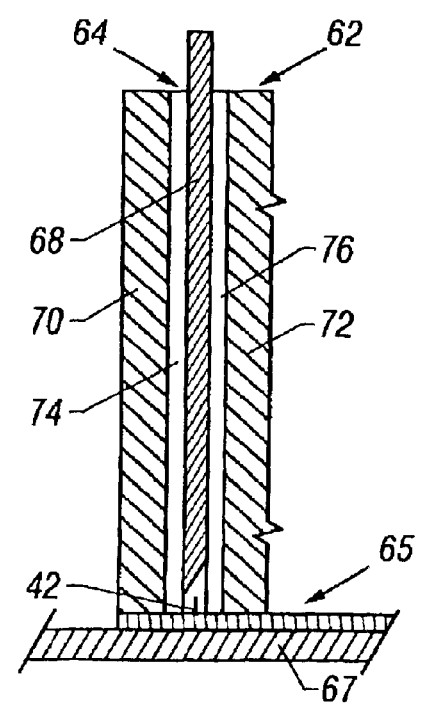
FIG. 6 is a cross-sectional view of a die slot of a multi-chip holder having an encapsulated die disposed therein.

FIG. 6 shows a cross-sectional view of the die slot 64 in the base 62 of the multi-chip holder 60. The base 62 rests on the printed circuit board 67 with the axially conductive film 65 positioned between the base 62 and the printed circuit board 67. The encapsulated die 68 is positioned in the die slot 64 and rests on the axially conductive film 65. The encapsulated die 68 is oriented in the die slot 64 such that the wire leads 42 abut the axially conductive film 65 to establish electrical conductivity between the wire leads 42 and electrical traces on the printed circuit board 67 by means of the axially conductive film 65.

Figure 7:
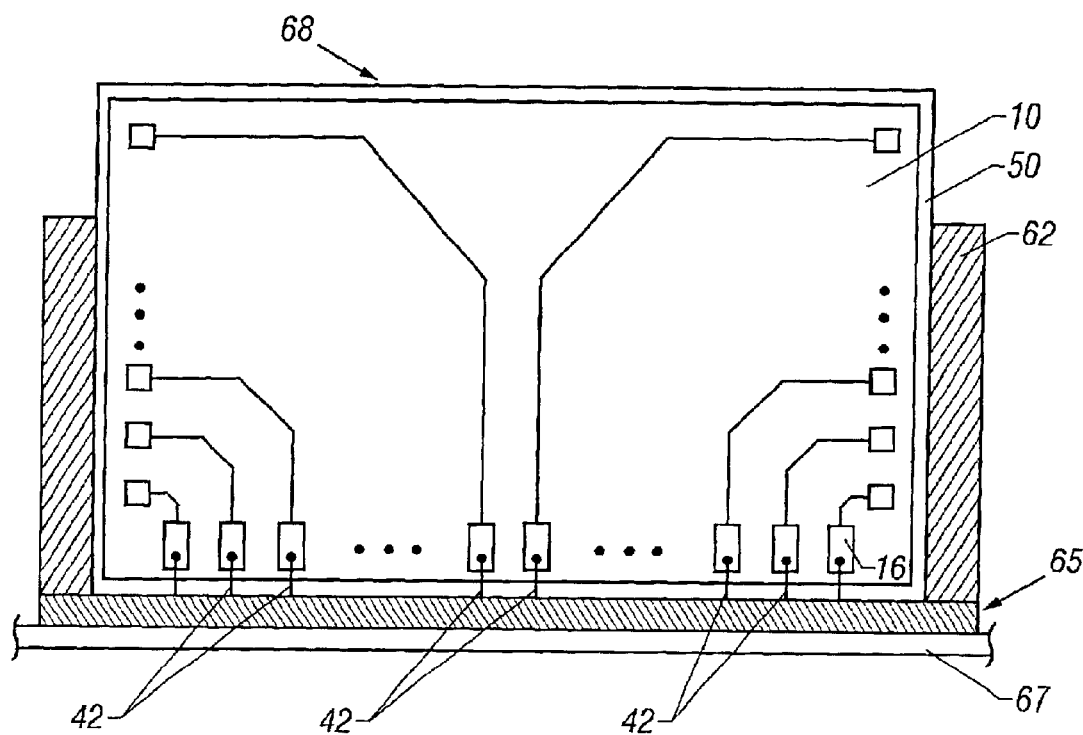
FIG. 7 is another cross-sectional view of a die slot of a multi-chip holder with an encapsulated die disposed therein.

FIG. 7 illustrates the integrated circuit device 10 encapsulated in the encapsulating material 50 with the wire leads 42 extending from the pads 16 to the edge of the encapsulating material 50. The encapsulated die 68 rests in a die slot of the base 62 and abuts the axially conductive film 65, which itself rests on the printed circuit board 67. As already mentioned, the axially conductive film 65 facilitates electrical connection between the wire leads 42 and electrical traces on the printed circuit board 67. As also mentioned previously, each of the wire leads 42 may have a solder bump on its exposed end at the edge of the encapsulating material 50.

Figure 8:
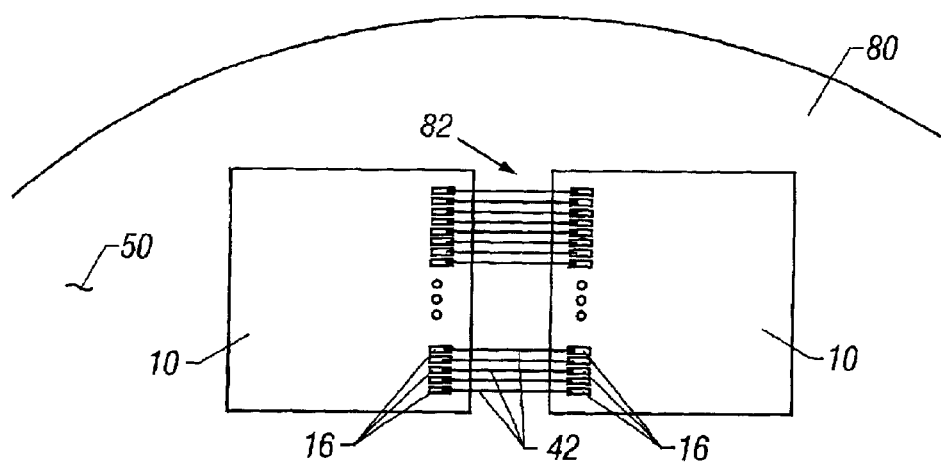
FIG. 8 illustrates a portion of a wafer having two dice partially processed according to one method utilizing the present invention.
Figure 9:
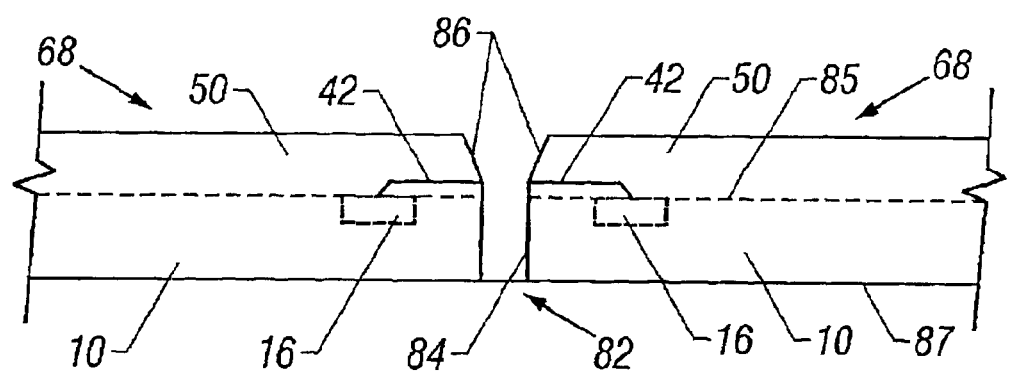
FIG. 9 is a cross-sectional view showing portions of two encapsulated dice processed according to one method utilizing the present invention.

FIGS. 8 and 9 illustrate an alternative method utilizing the present invention. This alternative method involves wire bonding and encapsulating the individual dice before singulation from a wafer and without the use of a lead frame. A semiconductor wafer 80 will typically include many integrated circuit devices 10 prior to dicing of the wafer 80. As illustrated in FIG. 8, pairs of dice 10 may be bonded together with wire leads 42 by bonding the wire leads 42 between the contact pads 16 of one die 10 to the contact pads 16 of the adjacent die 10. After each of the dice 10 has wire leads 42 bonded to it, the entire wafer 80 may be covered with encapsulating material 50 using known techniques. For example, a spin-on process, a CVD or PECVD process, or other well-known technique may be employed to cover the wafer 80 with the encapsulating material 50. Moreover, the encapsulating material 50 may cover only the top surface of the wafer 80, or it may be formed on both the top and bottom surfaces of the wafer 80. The dice 10 may then be singulated. That is, the wafer 80 may be separated into the individual dice 10 by cutting along the streets 82 of the wafer 80.

FIG. 9 shows a cross-section of a portion of the wafer 80 illustrating two encapsulated dice 68 that have been separated by means of a cut in the street 82. FIG. 9 illustrates that the wire leads 42 are sheared at the cut through the street 82 and their ends are exposed at a face 84 of the cut. A beveled edge 86 may be formed on each of the encapsulated die 68 by first scoring the wafer 80 along the streets 82 prior to final singulation of the encapsulated dice 68. As those skilled in the art will appreciate, use of this alternative method will yield an integrated circuit device 10 having encapsulating material 50 possibly on only its top surface 85, depending on the particular process used to deposit the encapsulating material, leaving the back surface 87 of the device 10 as an exposed semiconductor surface. Alternatively, as mentioned above, both the top surface 85 and the back surface 87 may be covered with encapsulating material 50. In each of those cases, the semiconductor material on which the integrated circuit device 10 is fabricated will be exposed at the face 84 of the cut. Use of the method illustrated in FIGS. 8 and 9 eliminates the need for mounting individual dice in lead frames and bonding in the manner previously described. The method illustrated in FIGS. 8 and 9 also eliminates any need for the lead frames and eliminates waste of the lead frames after bonding, encapsulation and singulation of the die 10 from the lead frame. However, one advantage of the earlier described embodiment, in which the individual dice 10 are mounted in the lead frames for bonding and encapsulation, is that typical wire bonding equipment is adapted to handle individual dice 10 rather than entire wafers 80. Either method described herein, and alternative methods, are acceptable for purposes of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A packaged semiconductor device, comprising:
    an integrated circuit device having first and second edges, the first edge being opposite the second edge;
    a plurality of electrical connection pads that are located proximate the second edge of the integrated circuit device;
    a plurality of wire leads coupled to the plurality of electrical connection pads; and
    a covering of encapsulating material having first and second edges adjacent the first and second edge of the integrated circuit device, respectively, and covering at least a portion of the integrated circuit device, covering the plurality of electrical connection pads, and covering each of the wire leads,
    wherein each of the wire leads has an exposed end, each exposed end being substantially flush with only the second edge of the encapsulating material for electrical contact therewith.

2. The device of claim 1, further comprising a solder bump coupled to the exposed end of each of the wire leads.

3. The device of claim 1, wherein the covering of encapsulating material extends over a top surface of the integrated circuit device.

4. The device of claim 3, wherein the covering of encapsulating material substantially envelops the integrated circuit device.

5. An apparatus, comprising:
- an integrated circuit die having first and second edges, the first edge being opposite the second edge;
- a plurality of electrical connection pads that are located proximate the second edge of the integrated circuit die;
- a lead frame adjacent the integrated circuit die, the lead frame having first and second portions adjacent the first and second edges of the integrated circuit die, respectively, she second portion having a first edge proximate the second edge of the integrated circuit die and a second edge opposite the second edge of the integrated circuit die;
- a plurality of wire leads coupled between the first edge of the second portion of the lead frame and the plurality of electrical connection pads; and
- an encapsulating material covering at least a portion of the integrated circuit die, the plurality of electrical connection pads, the plurality of wire leads, and at least a portion of the lead frame, wherein the encapsulating material covers the integrated circuit die, and wherein the encapsulated integrated circuit die is adapted for singulation from the lead frame.

6. The apparatus of claim 5, wherein the plurality of wire leads are adapted for severing upon singulation of the integrated circuit die from the lead frame.

7. An apparatus, comprising:
- an integrated circuit die having first and second edges, the first edge being opposite the second edge;
- a plurality of electrical connection pads that are located proximate the second edge of the integrated circuit die;
- a lead frame adjacent the integrated circuit die, the lead frame having first and second portions adjacent the first and second edges of the integrated circuit die, respectively, the second proton having a first edge proximate the second edge of the integrated circuit die and a second edge opposite the second edge of the integrated circuit die, wherein the integrated circuit die is adapted for singulation from the lead frame;
- a plurality of wire leads coupled between the first edge of the second portion of the lead frame and the plurality of electrical connection pads; and
- an encapsulating material covering at least a portion of the integrated circuit die, the plurality of electrical connection pads, the plurality of wire leads, and at least a portion of the lead frame.

8. An apparatus, comprising:
- an integrated circuit die having first and second edges, the first edge being opposite the second edge;
- a plurality of electrical connection pads that are located proximate the second edge of the integrated circuit die;
- a lead frame adjacent the integrated circuit die, the lead frame having first and second portions adjacent the first and second edges of the integrated circuit die, respectively, the second portion having a first edge proximate the second edge of the integrated circuit die and a second edge opposite the second edge of the integrated circuit die;
- a plurality of wire leads coupled between the first edge of the second portion of the lead frame and the plurality of electrical connection pads;
- an encapsulating material covering a least a portion of the integrated circuit die, the plurality of electrical connection pads, the plurality of wire leads, and at least a portion of the lead frame; and
- a singulation line between the integrated circuit die and the lead frame, the singulation line extending generally perpendicular to the wire leads.

9. The apparatus of claim 8, wherein a distance between an edge of the integrated circuit die and the singulation line is not greater than approximately 5 mils.

10. The apparatus of claim 9, wherein a distance between the edge of the integrated circuit die and at least one of the plurality of electrical connection pads is not greater than approximately 2 mils.

11. An apparatus, comprising:
- an integrated circuit die having first and second edges, the first edge being opposite the second edge;
- a plurality of electrical connection pads that are located proximate the second edge of the integrated circuit die;
- a lead frame adjacent the integrated circuit die the lead frame having first and second portions adjacent the first and second edges of the integrated circuit die, respectively, the second portion having a first edge proximate the second edge of the integrated circuit die and a second edge opposite the second edge of the integrated circuit die, wherein the integrated circuit die is adapted for singulation from the lead frame;
- a plurality of wire leads coupled between the second portion of the lead frame and the plurality of electrical connection pads; and
- an encapsulating material covering the integrated circuit die, die plurality of electrical connection pads, the plurality of wire leads, and at least a portion of the lead frame.

12. An apparatus, comprising:
- an integrated circuit die having first and second edges, the first edge being opposite the second edge;
- a plurality of electrical connection pads that are located proximate the second edge of the integrated circuit die;
- a lead frame adjacent the integrated circuit die, the lead frame having first and second portions adjacent the first and second edges of the integrated circuit die, respectively, the second portion having a first edge proximate the second edge of the integrate circuit die and a second edge apposite the second edge of the integrated circuit die;
- a plurality of wire leads coupled between the second portion of the lead frame and the plurality of electrical connection pads;
- an encapsulating material covering the integrated circuit die, the plurality of electrical connection pads, the plurality of wire leads, and at least a portion of the lead frame; and
- a singulation line between the integrated circuit die and the lead frame, the singulation line extending generally perpendicular to the wire leads.

13. The apparatus of claim 12, wherein a distance between an edge of the integrated circuit die and the singulation line is not greater than approximately 5 mils.

14. The apparatus of claim 13, wherein a distance between the edge of the integrated circuit die and at least one of the plurality of electrical connection pads is not greater than approximately 2 mils.

15. An apparatus, comprising:
- an integrated circuit die having first and second edges, the first edge being opposite the second edge;
- a plurality of electrical connection pads that are located proximate the second edge of the integrated circuit die;
- a lead frame adjacent the integrated circuit die the lead frame having first and second portions adjacent the first and second edges of the integrated circuit die, respectively;

a plurality of wire loads coupled between the second portion of the lead frame and the plurality of electrical connection pads;

an encapsulating material covering the integrated circuit die, the plurality of electrical connection pad; the plurality of wire leads, and at least a portion of the lead frame; and a singulation line between the integrated circuit die and the lead frame.

16. The apparatus of claim 15, wherein a distance between an edge of the integrated circuit die and the singulation line is not greater than approximately 5 mils.

17. The apparatus of claim 16, wherein a distance between the edge of the integrated circuit die and at least one of the plurality of electrical connection pads is not grater than approximately 2 mils.

* * * * *

UNITED STATES PATENT AND TRADEMARK OFFICE
CERTIFICATE OF CORRECTION

PATENT NO. : 6,903,465 B2  
DATED : June 7, 2005  
INVENTOR(S) : Farnworth et al.

It is certified that error appears in the above-identified patent and that said Letters Patent is hereby corrected as shown below:

Column 10,
Line 6, delete "grater" and insert -- greater --.

Signed and Sealed this

Twenty-third Day of August, 2005

JON W. DUDAS
*Director of the United States Patent and Trademark Office*